United States Patent
Stanton et al.

(10) Patent No.: US 7,858,921 B2
(45) Date of Patent: Dec. 28, 2010

(54) GUIDED-MODE-RESONANCE TRANSMISSION COLOR FILTERS FOR COLOR GENERATION IN CMOS IMAGE SENSORS

(75) Inventors: William A. Stanton, Boise, ID (US); Fei Wang, Boise, ID (US); Zhong Shi, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 4 days.

(21) Appl. No.: 12/115,045

(22) Filed: May 5, 2008

(65) Prior Publication Data

US 2009/0272880 A1 Nov. 5, 2009

(51) Int. Cl.
G02B 5/30 (2006.01)
(52) U.S. Cl. .......................... 250/226; 257/440; 359/486
(58) Field of Classification Search .................. 250/226; 438/57, 70, 65, 60; 257/448, 457, 459, 440; 359/486, 590
See application file for complete search history.

(56) References Cited

U.S. PATENT DOCUMENTS

| | | | |
|---|---|---|---|
| 5,216,680 A | | 6/1993 | Magnusson et al. |
| 5,512,131 A | * | 4/1996 | Kumar et al. ............... 438/738 |
| 5,598,300 A | | 1/1997 | Magnusson et al. |
| 6,426,493 B1 | * | 7/2002 | Oda .......................... 250/208.1 |
| 6,738,171 B1 | | 5/2004 | Campbell |
| 7,070,987 B2 | | 7/2006 | Cunningham et al. |
| 7,167,615 B1 | | 1/2007 | Wawro et al. |
| 7,218,817 B2 | | 5/2007 | Magnusson et al. |
| 7,223,960 B2 | | 5/2007 | Mouli |
| 2002/0050518 A1 | * | 5/2002 | Roustaei ..................... 235/454 |
| 2003/0002156 A1 | | 1/2003 | Hobbs et al. |
| 2005/0025422 A1 | | 2/2005 | Magnusson et al. |
| 2007/0045685 A1 | | 3/2007 | Yang et al. |
| 2007/0298533 A1 | * | 12/2007 | Yang et al. ..................... 438/57 |
| 2008/0062418 A1 | | 3/2008 | Magnusson et al. |
| 2008/0156970 A1 | * | 7/2008 | Han et al. .................... 250/226 |
| 2008/0198454 A1 | * | 8/2008 | Wang et al. .................. 359/486 |

OTHER PUBLICATIONS

HandBook of Optical Constants of Solids, Academic Press, Boston, 1991.*

Magnusson et al., "Enabling Technology Based on Leaky-Mode Resonance Effects in Periodic Films", Symposium FF: Synthesis and Surface Engineering of Three-Dimensional Nanostructures, Nov. 25-30, 2007.

(Continued)

Primary Examiner—Tony Ko
(74) Attorney, Agent, or Firm—RatnerPrestia

(57) ABSTRACT

Imager pixel arrays and methods for forming imager pixel arrays. An image sensor pixel includes a photosensor and a waveguide grating resonance filter formed over the photosensor. The waveguide grating resonance filter is configured to pass light to the photosensor in a wavelength band and to block light outside of the wavelength band. The waveguide grating resonance filter includes a grating material having a first refractive index and arranged in a grating pattern with a grating pitch, and has an effective refractive index that is a function of the first refractive index. A combination of the grating pitch and the effective refractive index is selected to correspond to the wavelength band.

38 Claims, 10 Drawing Sheets

OTHER PUBLICATIONS

Day et al., "Filter-Response Line Shapes of Resonant Waveguide Gratings", IEEE Journal of Lightwave Technology, vol. 14, No. 8, Aug. 1996, pp. 1815-1824.

Kanamori et al., "Fabrication of Transmission Color Filters Using Silicon Subwavelength Gratings on Quartz Substrates", IEEE Photonics Technology Letters, vol. 18, No. 20, Oct. 15, 2006, pp. 2126-2128.

Bertoni et al., "Frequency-Selective Reflection and Transmission by a Periodic Dielectric Layer", IEEE Transactions on Antennas and Propagation, vol. 37, No. 1, Jan. 1989, pp. 78-83.

Brundrett et al., "Normal-incidence guided-mode resonant grating filters: design and experimental demonstration", Optics Letters, vol. 23, No. 9, May 1, 1998, pp. 700-702.

Wang et al., "Multilayer waveguide-grating filters", Applied Optics, vol. 34, No. 14, May 10, 1995, pp. 2414-2420.

* cited by examiner

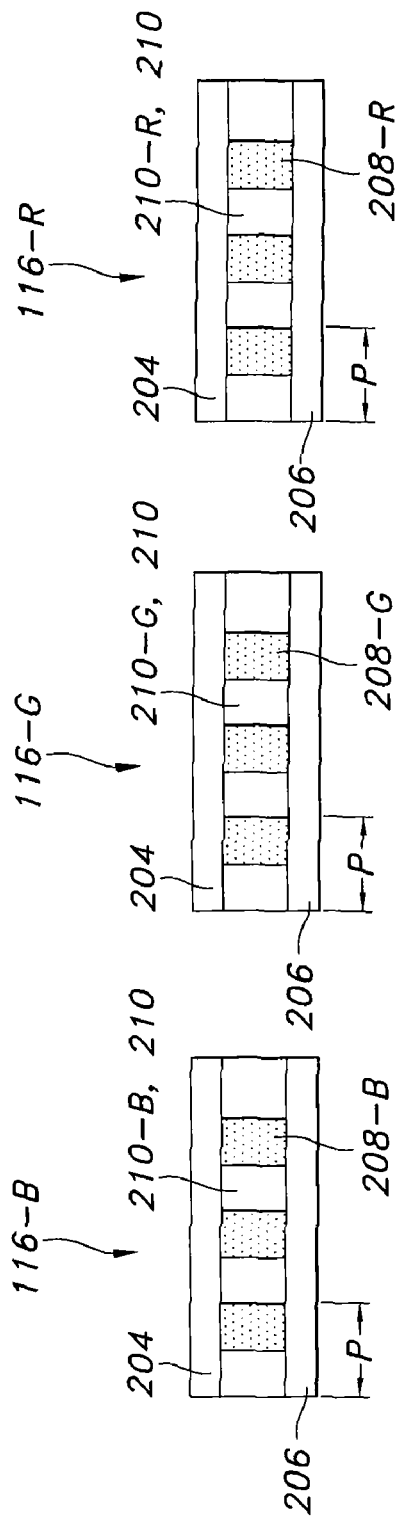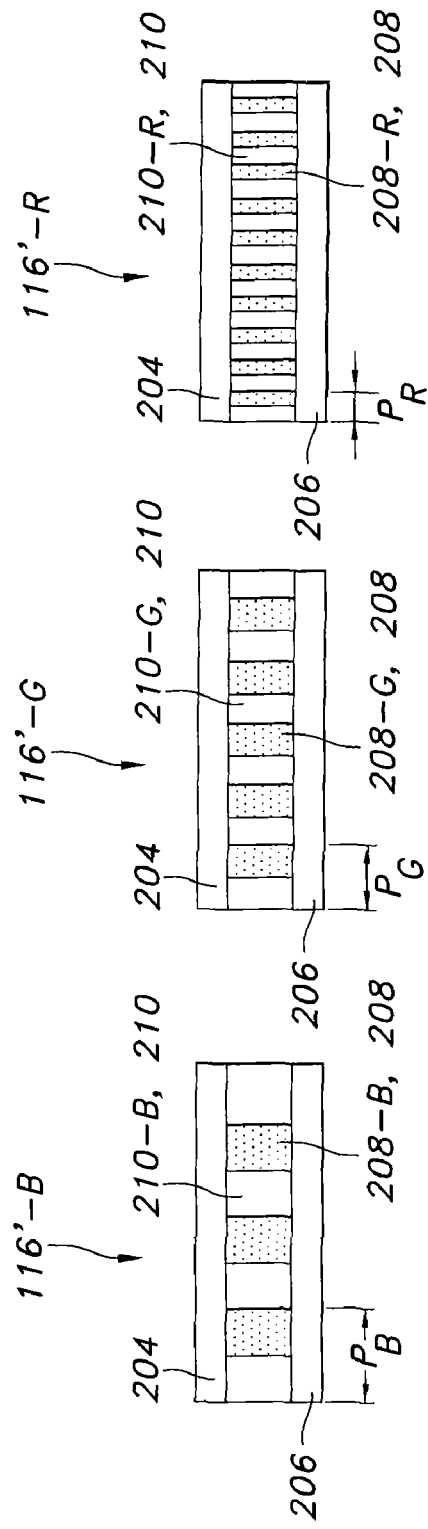
FIG. 3A
FIG. 3B

GUIDED-MODE-RESONANCE TRANSMISSION COLOR FILTERS FOR COLOR GENERATION IN CMOS IMAGE SENSORS

FIELD OF THE INVENTION

The present invention relates to CMOS imagers and, more particularly, to imager pixel arrays and imager devices, and methods of forming the same.

BACKGROUND OF THE INVENTION

Solid state image sensors, also known as imagers, find applications in a wide variety of fields, including machine vision, robotics, guidance and navigation, automotive applications and consumer products. In many smart image sensors, it is desirable to integrate on chip circuitry to control the image sensor and to perform signal and image processing on the output image. There are a number of different types of semiconductor-based imagers, including charge coupled devices (CCDs) and complementary metal oxide semiconductor (CMOS) imagers. Charge-coupled devices (CCDs), which have been one of the dominant technologies used for image sensors, however, do not easily lend themselves to large scale signal processing and are not easily integrated with complimentary metal oxide semiconductor (CMOS) circuits.

Imagers are typically formed with an array of pixel cells, containing photosensors, such as photodiodes, where each pixel cell produces a signal corresponding to the intensity of light impinging on that pixel cell, when an image is focused on the array. The signals may then be stored and/or processed, for example, to display a corresponding image or otherwise used to provide information about the image.

To detect color and to capture a color image, an absorptive color filter array (CFA) is typically employed and placed on top of the photosensors. For example, each pixel cell may be covered with a respective color filter, such as, for example, a red (R), green (G) or blue (B) filter. In a typical CFA layout, the red, green, and blue filters are arranged in a mosaic sequential pattern, such as a Bayer filter pattern such that the photosensors of the pixel cells separately detect red, green or blue photons.

It is desirable to provide an imager pixel array capable of separating and detecting spectral components of incident light compatible with imager fabrication processes.

BRIEF DESCRIPTION OF THE DRAWINGS

The invention may be understood from the following detailed description when read in connection with the accompanied drawing. Included in the drawing are the following figures:

FIGS. 3A and 3B are partial side diagrams of waveguide grating resonance filters illustrating grating pitch selection for passing different colors, according to embodiments of the invention;

DETAILED DESCRIPTION OF THE INVENTION

The term "pixel" as used herein, refers to a photoelement unit cell containing a photosensor device and associated structures for converting photons to an electrical signal. For purposes of illustration, a representative 3 color R,G,B pixel array (representing red, green and blue optical filters) is described herein. The invention, however, is not limited to the use of a R,G,B array and may be used with other optical filter arrays, one example being C,M,Y,K (representing cyan, magenta, yellow and black optical filters). The invention may also be used in a mono-chromatic array where just one color is sensed by the array.

Figure 1:
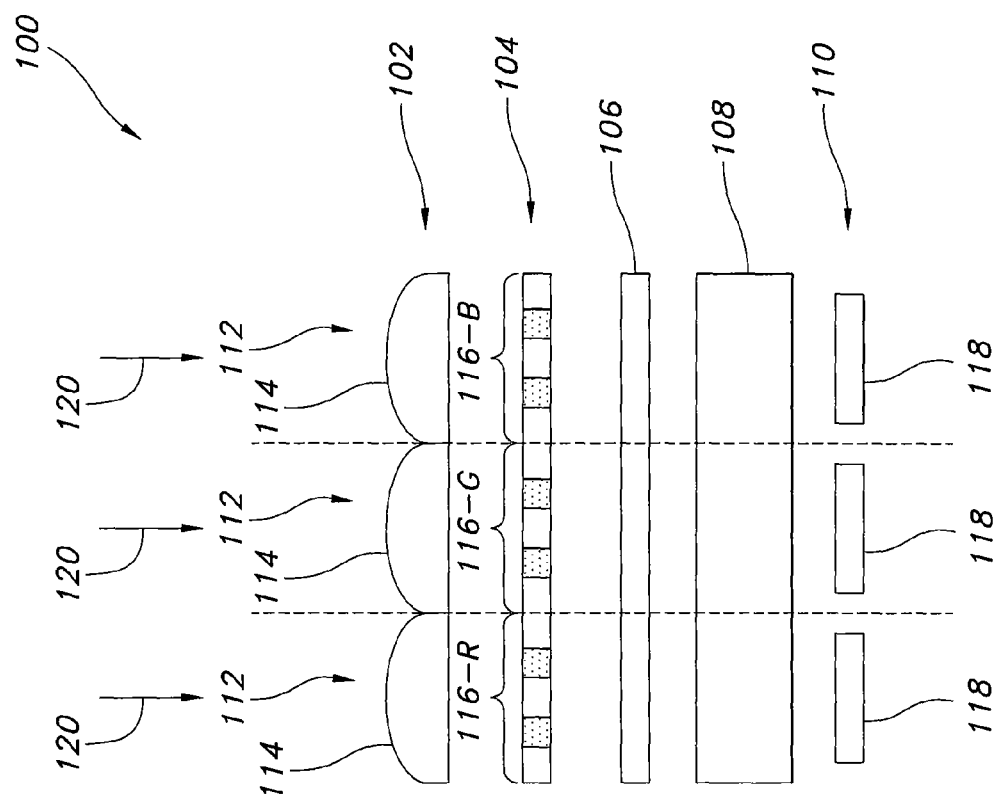
FIG. 1 is an exploded partial side diagram of an imager array according to an embodiment of the invention.

FIG. 1 is an exploded partial side diagram of imager array 100. Imager array 100 includes microlens array 102 having a plurality of microlenses 114, waveguide grating layer 104 having a plurality of waveguide grating resonance filters 116 and pixel array 110 having a plurality of photosensors 118. Photosensors 118 may include photogates, phototransistors, photoconductors or photodiodes. Waveguide grating layer 104 may pass incoming light 120 of a particular color(s) to photosensitive portions of corresponding photosensors 118, while blocking light of other colors from reaching respective photosensors 118. One or more conventional layers, such as passivation layers and interlayer dielectric layers 108, may be formed on or over pixel array 110. In the illustrated example, a protective layer 106 is provided over dielectric layer 108, on which waveguide grating layer 104 can be formed, as described below.

In general, imager array 100 contains an array of pixel cells 112. Each pixel cell has a microlens 114 formed over a waveguide grating resonance filter 116 and an associated photosensor 118. Although not shown, a spacing layer may be provided between microlenses 114 and waveguide grating resonance filters 116. In an alternate embodiment, an additional protective layer (not shown) may be formed over microlenses 114. According to another embodiment, waveguide grating layer 104 may be formed over pixel array 110. Those skilled in the art will appreciate that photosensors 118, interlayer dielectric layer 108, protective layer 106 and microlenses 114 may be formed by any of various methods known in the art.

Waveguide grating layer 104 includes waveguide grating resonance filters 116-R, 116-G, 116-B for respectively passing red (R), green (G) and blue (B) light onto respective photosensors 118 of pixel array 110. As described further below with respect to FIGS. 2 and 3, waveguide grating resonance filters 116-R, 116-G and 116-B may be configured to have different effective refractive indices ($n_{eff}$), selected to respectively pass red, green or blue light onto photosensors 118, and to block light of other wavelengths. Accordingly, waveguide grating resonance filters 116-R, 116-G, 116-B may be configured to pass light of different respective wavelength bands (i.e. for red, green or blue light) and to block light outside of the wavelength bands.

If incoming light 120 is provided perpendicularly to imager array 100, the photosensitive portions of pixel array 110, microlens array 102 and waveguide grating layer 104 may be arranged to have their centers substantially aligned. In an alternate embodiment, microlenses 114 and waveguide grating resonance filters 116 of corresponding pixel cells 112 may be shifted with respect to each other, to pass incoming light 120 onto respective photosensitive regions of photosensors 118.

Although waveguide grating resonance filters 116-R, 116-G, 116-B are illustrated in FIG. 1 as being formed in a sequential pattern of red, green and blue filters, it is understood that waveguide grating resonance filters 116-R, 116-G, 116-B may be formed in any suitable mosaic sequential pattern. For example, waveguide grating resonance filters 116 may be formed in a Bayer pattern, with rows of green and red filters (i.e. waveguide grating resonance filters 116-G, 116-R) alternating with rows of blue and green filters (i.e. waveguide grating resonance filters 116-B, 116-G).

Figure 2:
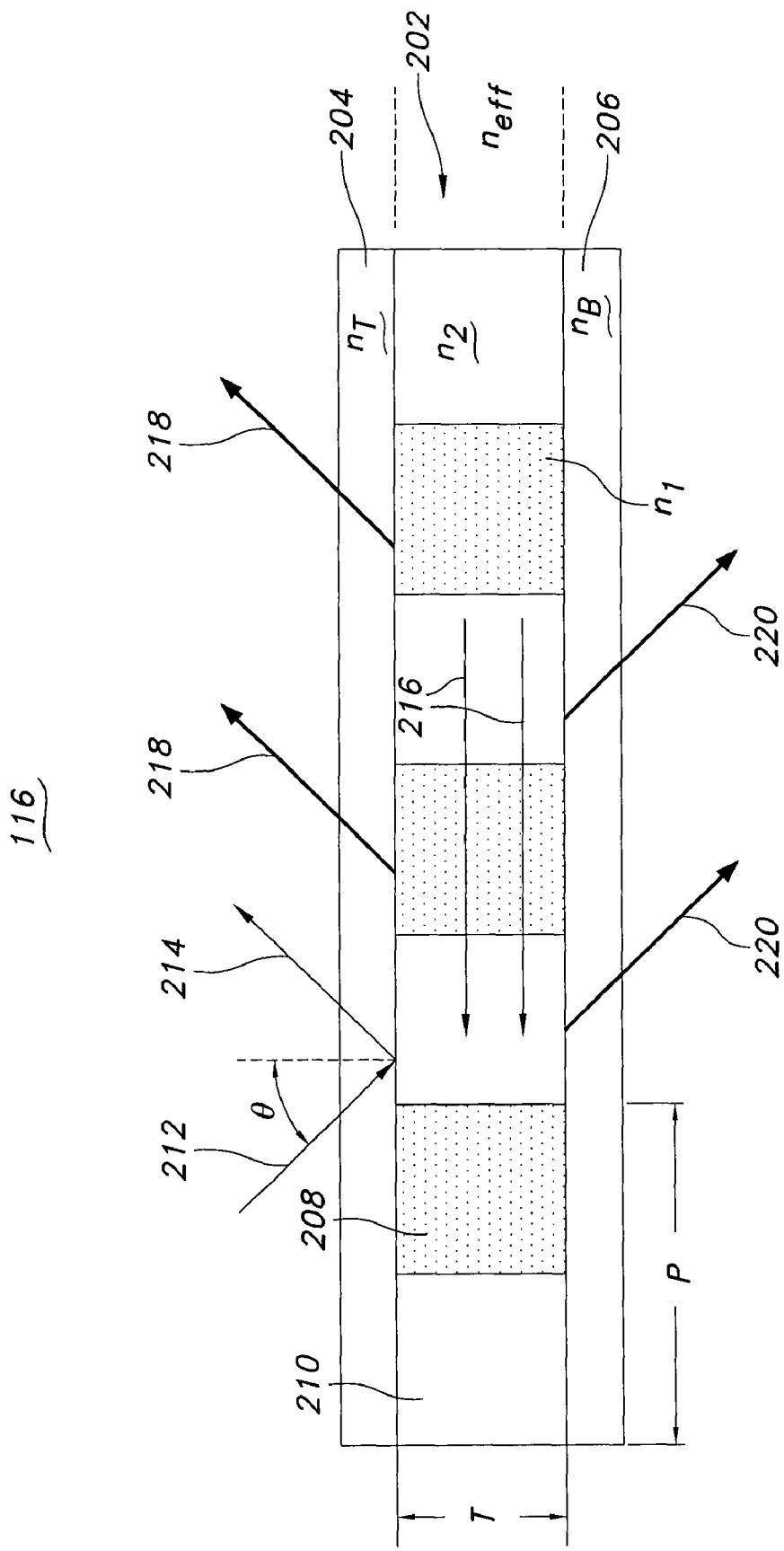
FIG. 2 is a partial side diagram of a waveguide grating resonance filter shown in FIG. 1 illustrating filter characteristics for reflection or transmission, according to an embodiment of the invention.

FIG. 2 is a partial side diagram of waveguide grating resonance filter 116, illustrating waveguide grating resonance filter 116 characteristics for reflection or transmission. Waveguide grating resonance filter 116 includes superstrate 204 having a refractive index $n_T$, resonant grating layer 202 and substrate 202 having a refractive index $n_B$. Resonant grating layer 202 has a thickness (T), and includes a grating material 208, having a refractive index $n_1$, and formed in a grating pattern with a grating pitch P (i.e. the distance between two adjacent grating portions 208). Grating material 208 may alternate with a filling material (or medium such as air) 210 having a refractive index $n_2$, formed between grating material 208 in the grating pattern. The combination of the refractive indices $n_1$ and $n_2$ for grating material 208 and filling material 210 form $n_{eff}$ for resonant grating layer 202 (which is also described herein as being the effective refractive index of waveguide grating resonance filter 116). In general, $n_{eff}$ is approximately equal to a weighted average of the refractive indices $n_1$, $n_2$ of resonant grating layer 202 depending on the relative contributions of $n_1$ and $n_2$ to the average.

Waveguide grating resonance filter 116 operates under guided-mode resonance (GMR) conditions and is configured as a transmission filter. Under GMR conditions, grating layer 202 is a resonant grating structure where a transmission resonance of the grating layer 202 is associated with the excitation of grating waveguide leaky modes. In particular, the resonance in grating layer 202 results from an evanescent diffracted wave that is near to a corresponding leaky mode of grating layer 202. To operate under GMR conditions, grating material 208 is formed with a sub-wavelength grating (SWG), which has a smaller pitch P than the wavelength of incident light 212. Configuration of grating material 208 as a SWG allows a zero-order forward-propagating wave to be transmitted into resonant grating layer 202 but does not typically generate higher diffraction orders. In addition, the $n_{eff}$ is desirably configured to be greater than the refractive indices of substrate 206 and superstrate 204 (i.e. $n_T$ and $n_B$). When waveguide grating resonance filter 116 is configured to operate under GMR conditions and the effective refractive index $n_{eff}$ is higher than the refractive indices of substrate 206 and superstrate 204, waveguide grating resonance filter 116 may function as a planar waveguide and act as a bandpass filter to pass light in a wavelength band and to block light outside of the wavelength band.

For example, under GMR conditions, plane wave 212 (incident on waveguide grating resonance filter 116 at angle θ) may excite waveguide mode 216 within resonant grating layer 202. The excited waveguide mode 216 re-radiates electromagnetic fields 218 and 220 into the substrate 206 and superstrate 204 having respective refractive indices $n_T$ and $n_B$. If electromagnetic fields 214 reflected from resonant grating layer 202 are in-phase with the re-radiated electromagnetic fields 218, strong reflection typically occurs and a reflection filter may be formed. If electromagnetic fields 214 reflected from resonant grating layer 202 are out-of-phase with the re-radiated electromagnetic fields 218, strong transmission by electromagnetic field 220 typically occurs and a transmission filter may be configured.

A (resonant) filtering bandwidth of waveguide filter 116 may be related to the pitch P of grating material 208. Once the wavelength band is selected, the grating pitch, in turn, may be determined by the refractive index $n_{eff}$ waveguide grating resonance filter 116 and the refractive indices $n_T$, $n_B$ of the substrate 206 and superstrate 204. A relationship between wavelength, pitch and refractive indices is shown in eq. 1 as:

$$\max\{n_T, n_B\} < M^*\lambda/P < \text{Max}(n_{eff}) \quad (1)$$

where M is an integer and λ represents the resonant wavelength of waveguide grating resonance filter 116 (i.e. a wavelength of light in a wavelength band to be passed by waveguide grating resonance filter 116). It is contemplated that the resonant wavelength may also be determined by the thickness (T) of the waveguide grating resonance filter and the complex refractive indices (n, k) of the grating material 208 and the filling material 210, where k refers to the absorption coefficient of a material. In particular, the absorption coefficient may be used to determine an absorption amplitude of the material.

Waveguide grating resonance filter 116 may be formed by varying the effective refractive index, such as by choosing a material for grating material 208 (as well as for filling materials 210) that has a relatively large refractive index or a relatively small refractive index. According to eq. (1), by choosing a material with a relatively large refractive index, the grating pitch P of the grating pattern may be reduced (producing more repeatable lines for a fixed waveguide filter size). By choosing a material with a relatively small refractive index, the grating pitch P of the grating pattern may be increased (producing fewer repeatable lines for a fixed waveguide filter size). Accordingly, the grating pitch P and overall size of waveguide grating resonance filter 116 may be flexibly configured by a choice of materials and waveguide pitch, to comply with various design and process situations of a CMOS image device.

Grating material 208 may be selected from among materials having a low refractive index, such as organic polymer materials (for example, having $n_1$ of about 1.3) to high refractive index materials such as hafnium dioxide or titanium dioxide (for example, having $n_1$ greater than about 3.9). Filling material 210 may be formed from a medium such as a vacuum or ambient atmosphere (with $n_2$ of about 1.0) or any suitable materials, such as quartz or epoxide polymers (e.g. resin). In general, filling material 210 is different from grating material 208 such that their respective refractive indices $n_1$, $n_2$ are different (i.e. $n_1$ may be greater than $n_2$ or $n_1$ may be less than $n_2$). According to one embodiment, filling material 210 is formed from a low refractive index material, such that $n_1 > n_2$. The thickness of the waveguide grating resonance filter 116 may be provided in any suitable range, for example between about 100 nm to about 10 microns. The absorption coefficient (k) may be close to be about 0 (for no absorption)

to large values (for example, between about 2 to 3 for metallic compounds) in the visible spectrum.

According to one embodiment, substrate 206 and superstrate 204 each include quartz. It is understood that substrate 206 and superstrate 204 may be selected from any suitable material such that $n_{eff}$ of resonant grating layer 202 is greater than $n_T$ and $n_B$ of substrate 206 and superstrate 204, respectively. Although both substrate 206 and superstrate 204 are illustrated in FIG. 2, in another example embodiment, waveguide grating resonance filter 116 includes either a substrate 206 or a superstrate 204. For example, one of substrate 206 or superstrate 204 may include an ambient atmosphere, protection layer 106 or microlenses 114. In this case, a refractive index of a surrounding medium may be taken into consideration in the configuration waveguide grating resonance filter 116 to pass light in a particular wavelength band.

Accordingly, waveguide grating resonance filters 116-R, 116-G and 116-B may be configured to pass light in respectively different wavelength bands based on one or more of the grating pitch P, selection of an $n_{eff}$ for a respective waveguide grating resonance filter or a thickness T of the corresponding waveguide filter. Selection of the corresponding $n_{eff}$ may be determined by one or more of a selection of respective grating material 208 for $n_1$, selection of respective filling material 210 for $n_2$, or an absorption coefficient for grating coefficient for grating material 208 (and/or filling material 210). In addition, $n_{eff}$ for waveguide grating resonance filter 116-B may generally be selected to be less than $n_{eff}$ for waveguide grating resonance filter 116-G and which is less than $n_{eff}$ for waveguide grating resonance filter 116-R (FIG. 1).

As imager array 100 becomes miniaturized, pixel cells 112 (and microlenses 114 also decrease in size (FIG. 1). A conventional CFA is typically prone to increased crosstalk between pixels as pixel cells 112 decrease in size, which may cause an oversaturation of a captured image for one or more colors. As described above, selection of the effective refractive index $n_{eff}$ (i.e. small or large $n_{eff}$) may affect the grating pitch P (i.e. to produce a large grating pitch or a small grating pitch). The grating pitch (i.e. the line space) of grating material 208, thus, depends upon the grating material 208 (and/or filling material 210) selected. Accordingly, a reduced grating size, compatible with the smaller size of pixel cell 112 (FIG. 1) may be provided by selecting materials (i.e. grating material 208 and/or filling material 210) with a higher refractive index, without increasing crosstalk among pixels. Waveguide grating resonance filters 116, thus, may be adaptable to miniaturization of imager array 100 (FIG. 1), such as by configuring the respective grating materials 208, filling materials 210, grating pitches, thicknesses and/or absorption coefficients.

FIGS. 3A and 3B are partial side diagrams of waveguide grating resonance filters 116 and 116', illustrating grating pitch selection for passing different colors. According to one embodiment, illustrated in FIG. 3A, waveguide grating resonance filters 116-B, 116-G, 116-R may be configured from respectively different materials (i.e. grating materials 208-B, 208-G, 208-R) with a same grating pitch (P), to achieve different $n_{eff}$'s for passing a corresponding color. According to another embodiment, illustrated in FIG. 3B, waveguide grating resonance filters 116'-B, 116'-G, 116'-R may be selected from different materials (i.e. grating materials 208-B, 208-G, 208-R) with different grating pitches ($P_B$, $P_G$, $P_R$) to achieve different $n_{eff}$'s for passing the corresponding color. According to yet another embodiment, waveguide grating resonance filters 116-B, 116-G, 116-R may be selected from a same material (i.e. grating material 208) but may use different grating pitches ($P_B$, pitches ($P_B$, $P_G$, $P_R$) to achieve different $N_{eff}$'s for passing the corresponding color.

In FIGS. 3A and 3B, the filling material 210 of respective waveguide grating resonance filters 116-B (116'-B), 116-G (116'-G), 116-R (116'-R) may be formed by a same medium (or material) (e.g. filling material 210) or by respectively different mediums (or materials) (e.g. filling materials 210-B, 210-G, 210-R). It is understood that the colors passed by respective waveguide grating resonance filters 116-B, 116-G, 116-R may be configured to respectively pass red, green and blue light based on at least the thickness (T), the grating pitch(es) P (or $P_B$, $P_G$, $P_R$), the respective $n_{eff}$'s of the selected materials (including grating material 208 and filling material 210), the absorption coefficients for the respective materials or any combination thereof.

Figure 4A:
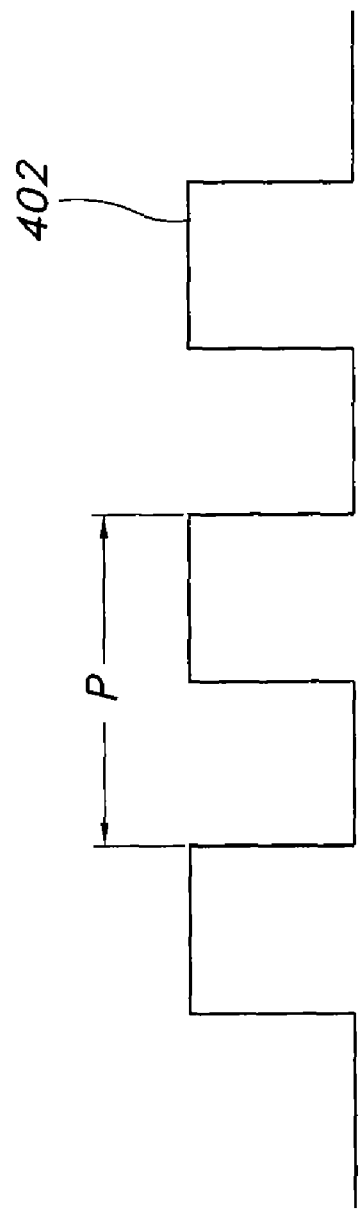
FIGS. 4A and 4B are partial side diagrams of grating profiles for a waveguide grating resonance filter, according to embodiments of the invention.
Figure 4B:
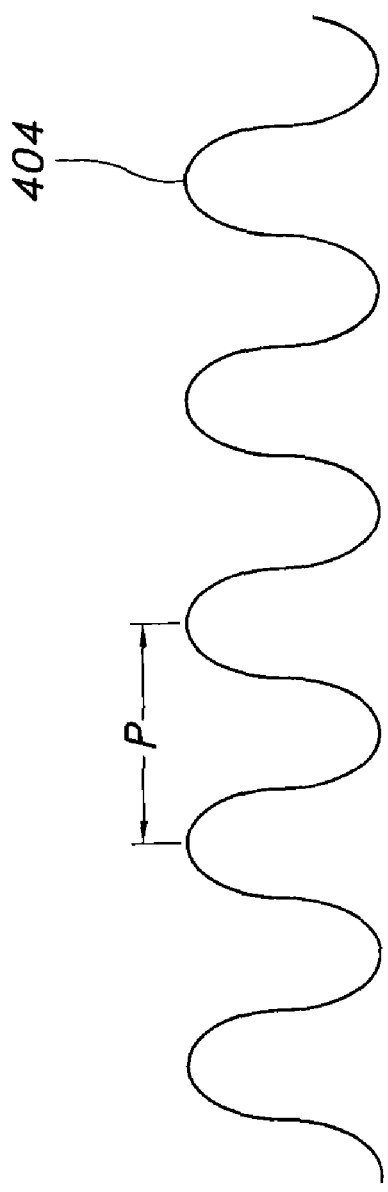

FIGS. 4A and 4B are side diagrams of respective grating profiles 402, 404 for waveguide grating resonance filter 116, according to embodiments of the invention. According to one embodiment, shown in FIG. 4A, a rectangular profile 402 may be applied to grating material 208 (FIG. 2). According to another embodiment, shown in FIG. 4B, a sinusoidal grating profile 404 may be applied to grating material 208 (FIG. 2). For example, sinusoidal grating profile 404 may take into account a broader range of angles of incident light as compared to rectangular profile 402 (FIG. 4A). Accordingly, waveguide grating resonance filter 116 with grating profile 404 may continue to pass a narrow band of wavelengths within a wavelength band using sinusoidal grating profile 404. Waveguide grating resonance filter 116, furthermore, may also collect more light into pixel array 110 because incident light from a larger range of incident angles may be passed by grating profile 404. Although a rectangular grating profile 402 and a sinusoidal grating profile 404 are illustrated, it is understood that these profiles are not meant to be limiting and that other suitable grating profiles, for example, parabolic, circular, triangular, etc, are also within the scope of the invention. According to another embodiment, waveguide grating layer 104 may be formed by two or more different grating profiles. For example, waveguide grating resonance filters 116 in the center of imager array 100 may be formed with rectangular grating profile 402 (FIG. 4A), whereas waveguide grating resonance filters 116 along the periphery of imager array 100 may be formed with sinusoidal grating profile 404 (FIG. 4B).

Figure 5:
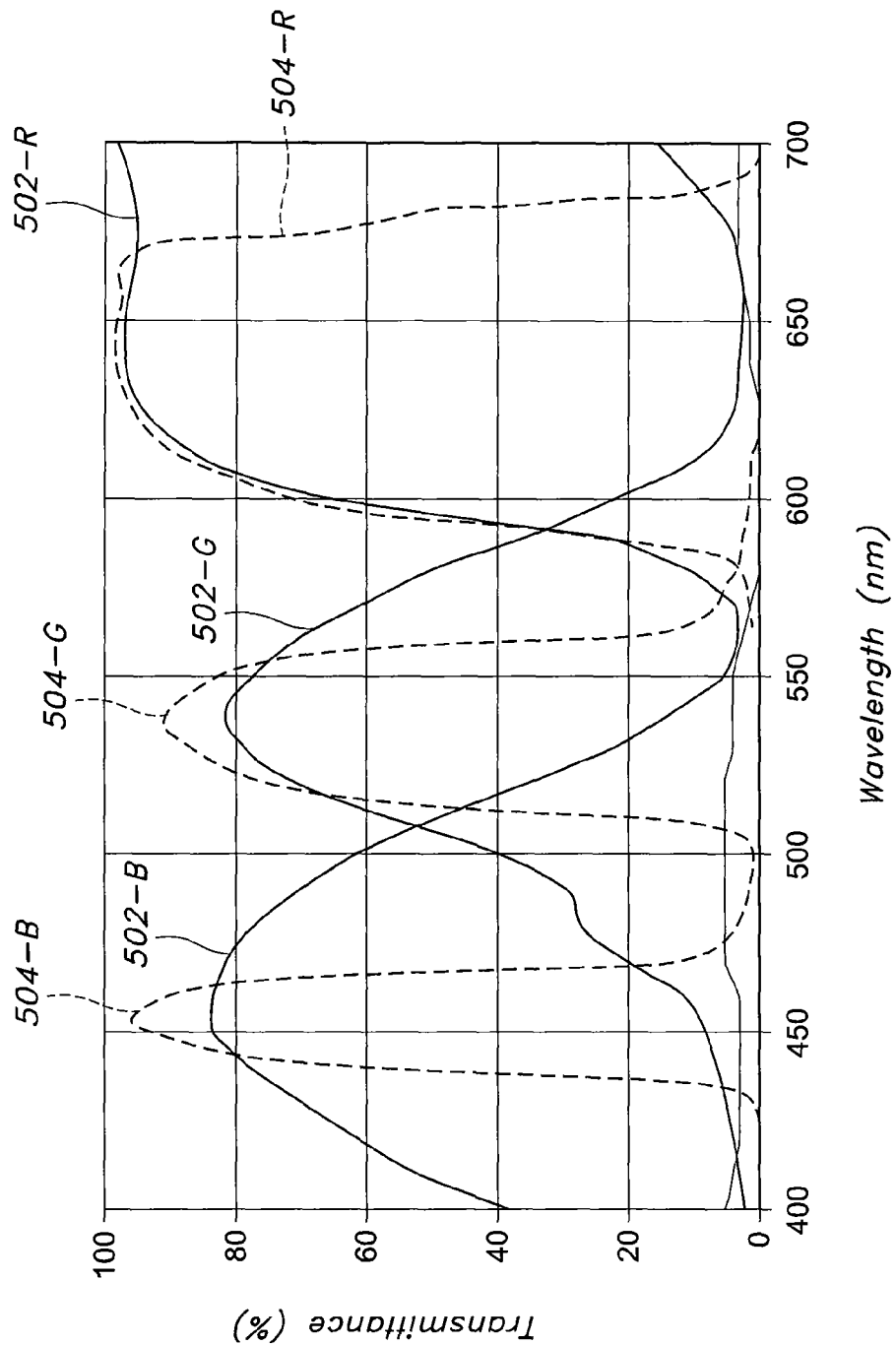
FIG. 5 is a graph of transmittance as a function of wavelength for red, green and blue filters corresponding to a CFA and a waveguide grating resonance filter layer shown in FIG. 1.

FIG. 5 is a graph of percent (%) transmittance of red, green and blue color filters as a function of wavelength for both a conventional CFA and waveguide grating resonance filters 116-B, 116-G, 116-R. Transmittances 502-B, 502-G and 502-R represent the transmittances for blue, green and red light, respectively, for the color photoresist used for a CFA. Transmittances 504-B, 504-G and 504-R represent the transmittances for blue, green and red light, respectively, for waveguide grating resonance filters 116-B, 116-G and 116-R. Blue light transmittance 502-B and green light transmittance 502-G for the CFA have approximately 80% transmittance at 450 nm and 550 nm, respectively. Blue, green and red light transmittances 504-B, 504-G, 504-R for waveguide grating resonance filters 116-B, 116-G, 116-R, in contrast, may reach almost 100% transmittance for all three different colors.

As shown in FIG. 5, waveguide grating resonance filters 116-B, 116-G, 116-R produce respectively higher transmittances and narrower bandwidths as compared to a CFA. Because higher transmittances 504-B, 504-G, 504-B are provided to underlying photosensors 118 (FIG. 1), imager array 100 may have a greater optical sensitivity as compared to a CFA. Because waveguide grating resonance filters 116-B, 116-G, 116-R have respectively narrower bandwidths as compared to a CFA, purer color spectra may be provided to respective photosensors 118 (FIG. 1). The purer color spectra, in turn, means that imager array 100 (FIG. 1) may have an improved dynamic range (because photosensors 118 may be more sensitive to the desired resonant wavelength). Accordingly, the improved dynamic range may reduce the complexity of any post-processing of the captured image. The post-processing may still include processing such as white balance, in order to produce an image according to the response of the human eye. Accordingly, the post-processing may selectively combine the colors passed by waveguide grating resonance filter 116 to emulate the response of the human eye.

Figure 6A:
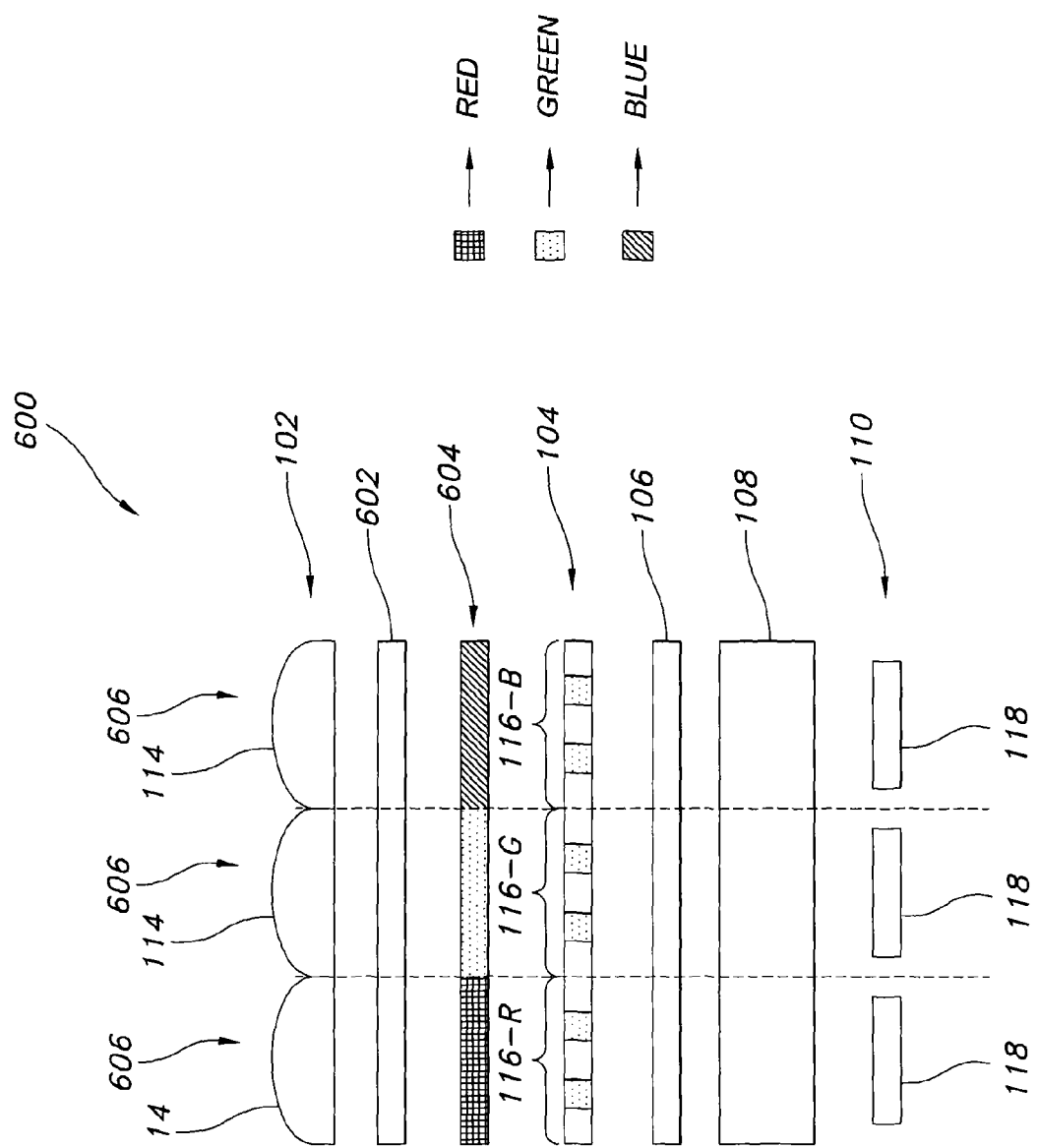
FIGS. 6A, 6B and 6C are exploded partial diagrams of different imager arrays according to alternate embodiments of the invention.
Figure 6B:
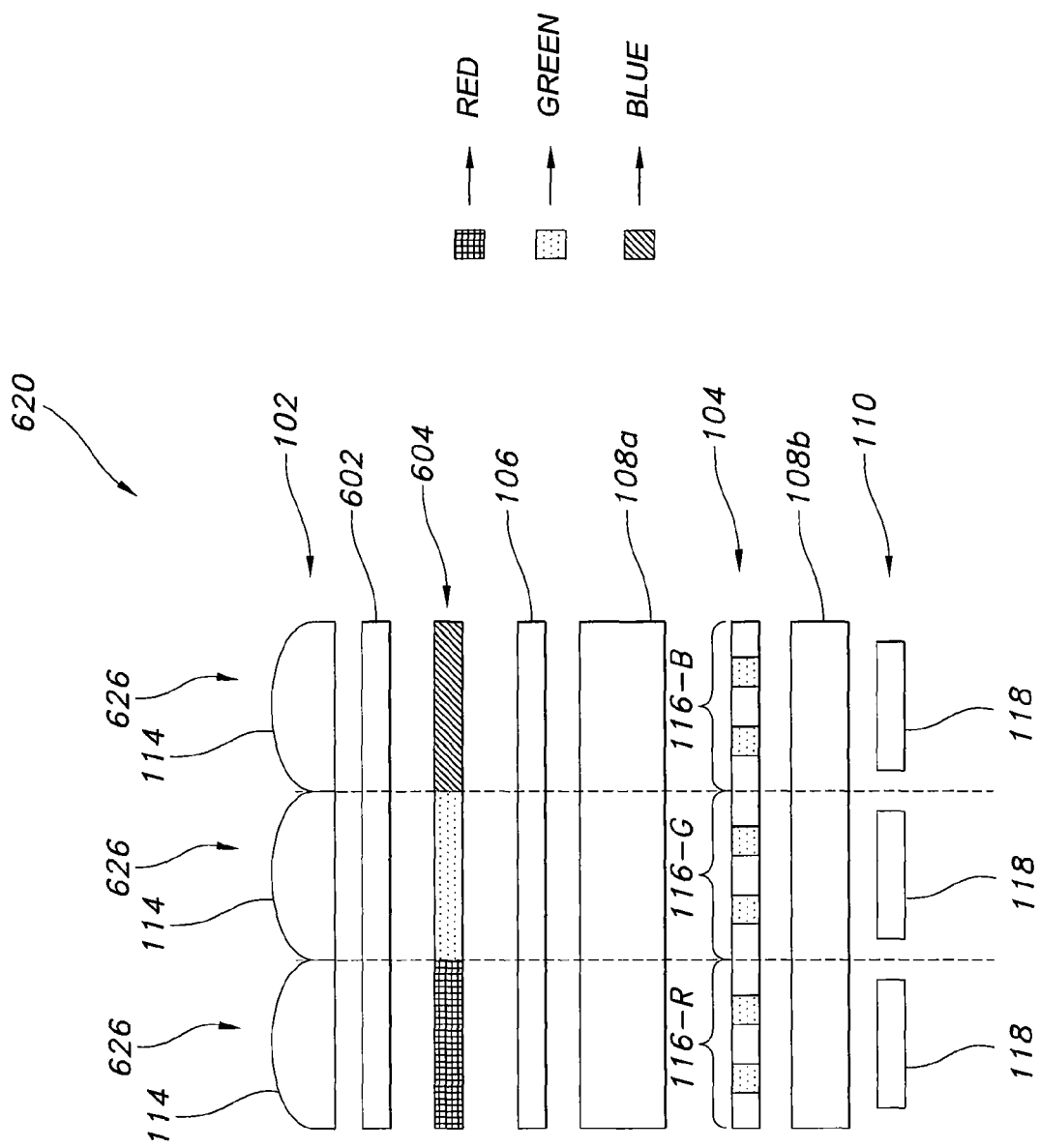

Referring now to FIGS. 6A, 6B and 6A, imager arrays 600, 620 and 640 are described with respect to alternate embodiments of the invention. FIG. 6A is a partial side view of imager array 600; FIG. 620 is a partial side view of imager 620; and FIG. 6C is a partial side view of imager array 640.

FIGS. 6A and 6B are partial side diagrams of respective imager arrays 600, 620, that includes CFA 604 and waveguide grating resonance filter layer 104. In FIGS. 6A and 6B, CFA 604 includes red, green and blue filters and may be separated from microlens array 102 by protection layer 602. In one example, shown in FIG. 6A, imager array 600 including pixel cells 606, where waveguide grating layer 104 is formed below CFA 604 and above protection layer 104. Waveguide grating layer 104 may be used in conjunction with CFA 604 to additionally filter at least one wavelength band. For example, referring to FIG. 5, blue light transmittance 502-B for a CFA has a wide bandwidth that overlaps with red light transmittance 502-R. Accordingly, a blue light color filter may also transmit red light to a corresponding photosensor 118, typically referred to as crosstalk. Waveguide grating resonance filter 116-B may be formed below the blue light filter for CFA 604 to block red wavelengths of light passed by the blue color filter.

In another example, shown in FIG. 6B, imager array 620 includes pixel cells 626, where waveguide grating layer 104 is formed between interlayer dielectric layers 108a, 108b and above photosensors 118. For example, waveguide grating layer 104 may be used to reduce crosstalk between pixel cells 626 (e.g. red light transmitted through interlayer dielectric layer 108 to photosensor 118 of a green pixel). Although waveguide grating layer 104 is illustrated in FIGS. 6A and 6B as including red, blue and green waveguide grating resonance filters (i.e. 116-R, 116-G, 116-B), it is understood that waveguide grating layer 104 may be formed from less than three colors, for example from a plurality of blue waveguide grating resonance filters 116-B. This configuration may be used in a camera having three monochromatic imager arrays. In this example, three different monochromatic waveguide grating layers 104 may be used as part of the imager device. Alternatively, waveguide grating layer 104 may configured, in FIGS. 6A and 6B, to block infrared (IR) light from being passed to photosensors 118. According to another embodiment, one or embodiment, one or more of the color filters of CFA 604 may be replaced by a waveguide grating resonance filters 116. For example, the blue color filter of CFA 604 may be replaced by blue waveguide grating resonance filter 116-B.

Figure 6C:
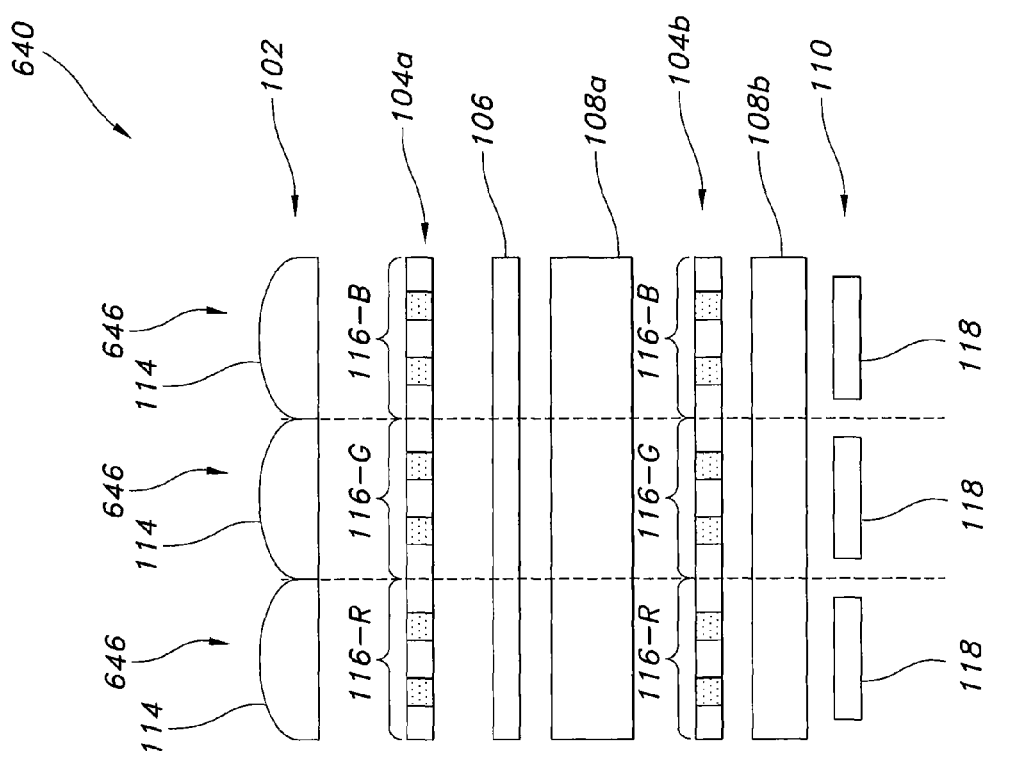

FIG. 6C is a partial side diagram of respective imager array 640 that includes two waveguide grating resonance filter layers 104a, 104b, according to another embodiment of the invention. Imager array 640 includes pixel cells 646, where waveguide grating layer 104a is formed below microlens array 102. Second waveguide grating layer 104b is formed between interlayer dielectric layers 108a, 108b and above photosensors 118. For example, waveguide grating layer 104b may be used to reduce crosstalk between pixel cells 626 (e.g. red light transmitted through interlayer dielectric layers 108a, b to photosensor 118 of a green pixel). Although waveguide grating layers 104a, 104b are illustrated in FIG. 6C as including red, blue and green waveguide grating resonance filters, it is understood that either waveguide grating layer 104a, 104b may be formed from less than three colors, for example from a plurality of blue waveguide grating resonance filters 116-B. Alternatively, waveguide grating layer 104a or 104b may configured, to block infrared (IR) light from being passed to photosensors 118.

Referring back to FIGS. 1 and 2, waveguide grating layer 104 can be formed by any of various methods. For example, a substrate layer 206 may be formed on protection layer 106. According to another embodiment, protection layer 106 may be used as the substrate layer and resonant grating layer 202 may be formed on protection layer 106. One of the grating material(s) 208 (e.g. materials 208-R, 208-G, 208-B or a single grating material 208) and filling material(s) 210 (e.g. materials 210-R, 210-G, 210-B or a single filling material 210) may be deposited onto different regions of the substrate layer 206 corresponding to the locations for waveguide grating resonance filters 116 and the different photosensors 118 in imager array 100. The grating material(s) 208 or filling material(s) 210 can be patterned and etched to form striped areas for the resonant grating layer 202, such as by standard lithographic methods. The other of the grating and filling material(s) can be formed over the patterned portion and into the etched portions of the grating material(s) or surrounding medium material(s), such as by standard deposition techniques. The techniques. The waveguide grating material layer can be planarized, such as by a chemical/mechanical polishing step to form resonant grating layer 202. In another example, resonant grating layer 202 may be formed by epitaxial growth through masking and growing the grating material(s) 208 and performing chemical/mechanical polishing to form resonant grating layer 202. A superstrate layer 204 may then be formed over resonant grating layer 202 to form waveguide grating layer 104.

An array 102 of microlenses 114 may then be formed over waveguide grating layer 104 from a lens forming layer. In another embodiment, microlenses 114 may be used as the superstrate layer such that microlenses 114 may be formed over resonant grating layer 202. In one example, microlenses 114 are formed so that each microlens 114 overlies a pixel cell 102. Those skilled in the art will appreciate that imager array 100 can be formed in various other ways, which are also within the scope of the invention.

Grating material(s) 208 of resonant grating layer 202 may be etched using a single processing step with a mask that accounts for one or more grating pitches. In contrast, for CFA fabrication, three different coating processes are typically employed to produce three color photoresists. Thus, the method according to the invention may reduce the number of steps needed to produce an imager.

Figure 7:
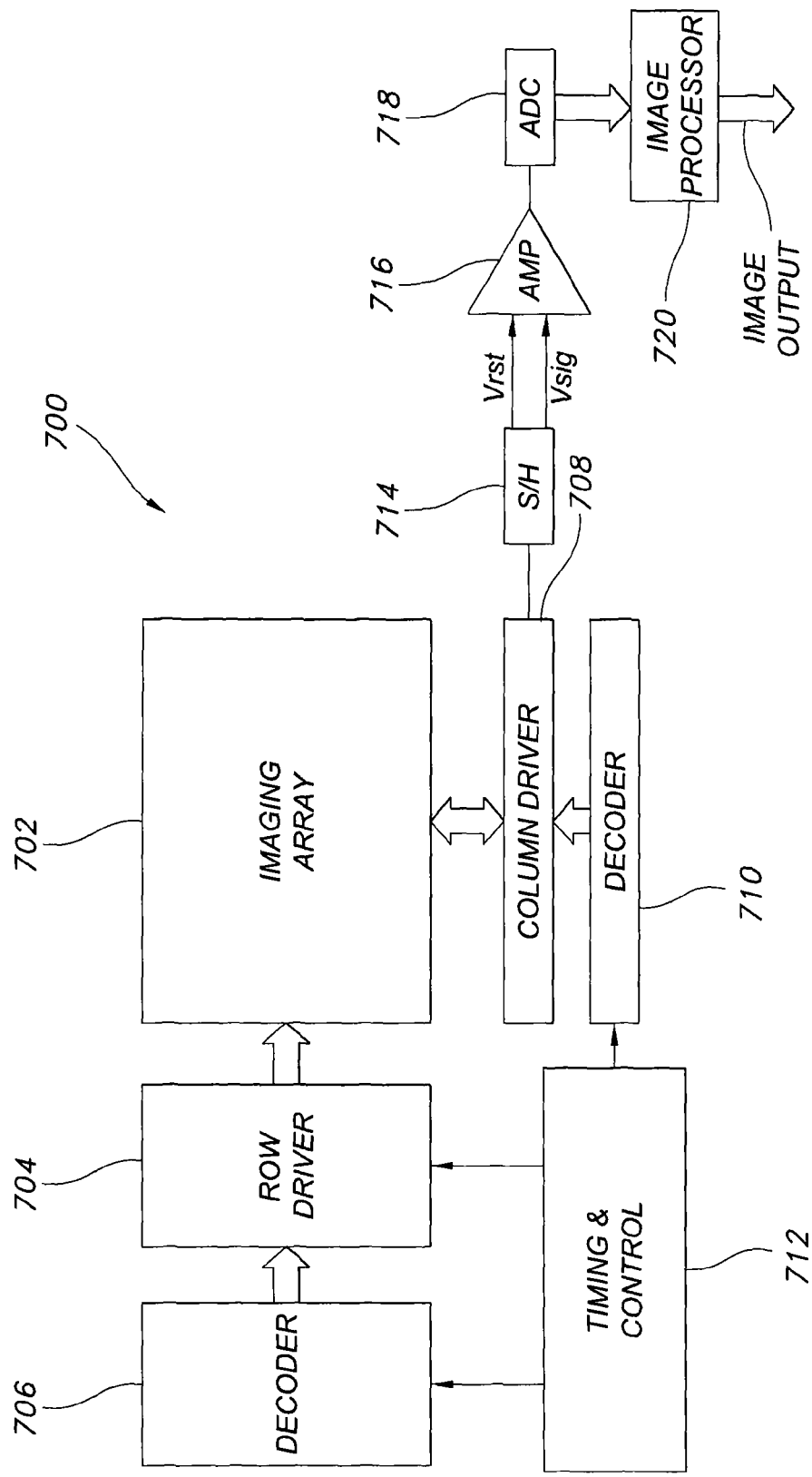
FIG. 7 is a block diagram illustrating a CMOS imaging device incorporating at least one imaging array in accordance with an embodiment of the invention.

FIG. 7 is a block diagram of a CMOS image device 700 including imaging array 702. Imaging array 702 of image device 700 includes a plurality of pixels arranged in a predetermined number of columns and rows. The pixels of each row in the array are turned on by a row select line and the pixels of each column may be selected for output by a column select line. A column driver 708 and column address decoder 710 are also included in imager device 700. A plurality of row and column lines are provided for the entire array. Although a column select line is described, the column select line is optional. Imaging array 702 may include any imaging array in accordance with an embodiment of the invention, such as imaging array 100 (FIG. 1), 600 (FIG. 6A), 620 (FIG. 6B) or 640 (FIG. 6C).

The row lines are selectively activated by row driver 704 in response to row address decoder 706. CMOS image device 700 is operated by timing and control circuit 712, which controls address decoders 706, 710 for selecting the appropriate pixels for pixel readout, and row and column driver circuitry, which apply driving voltages to the drive transistors of the selected pixels.

Each column of the array contains sample and hold circuitry (S/H), designated generally as 714, including sample and hold capacitors and switches associated with the column driver that read and store a pixel reset signal (Vrst) and a pixel image signal (Vsig) for selected pixels. A differential signal (reset-signal) is produced by programmable gain amplifier (PGA) circuit 716 for each pixel, which is digitized by analog-to-digital converter (ADC) 718. ADC 718 supplies the digitized pixel signals to image processor 720, which forms and outputs a digital image.

Figure 8:
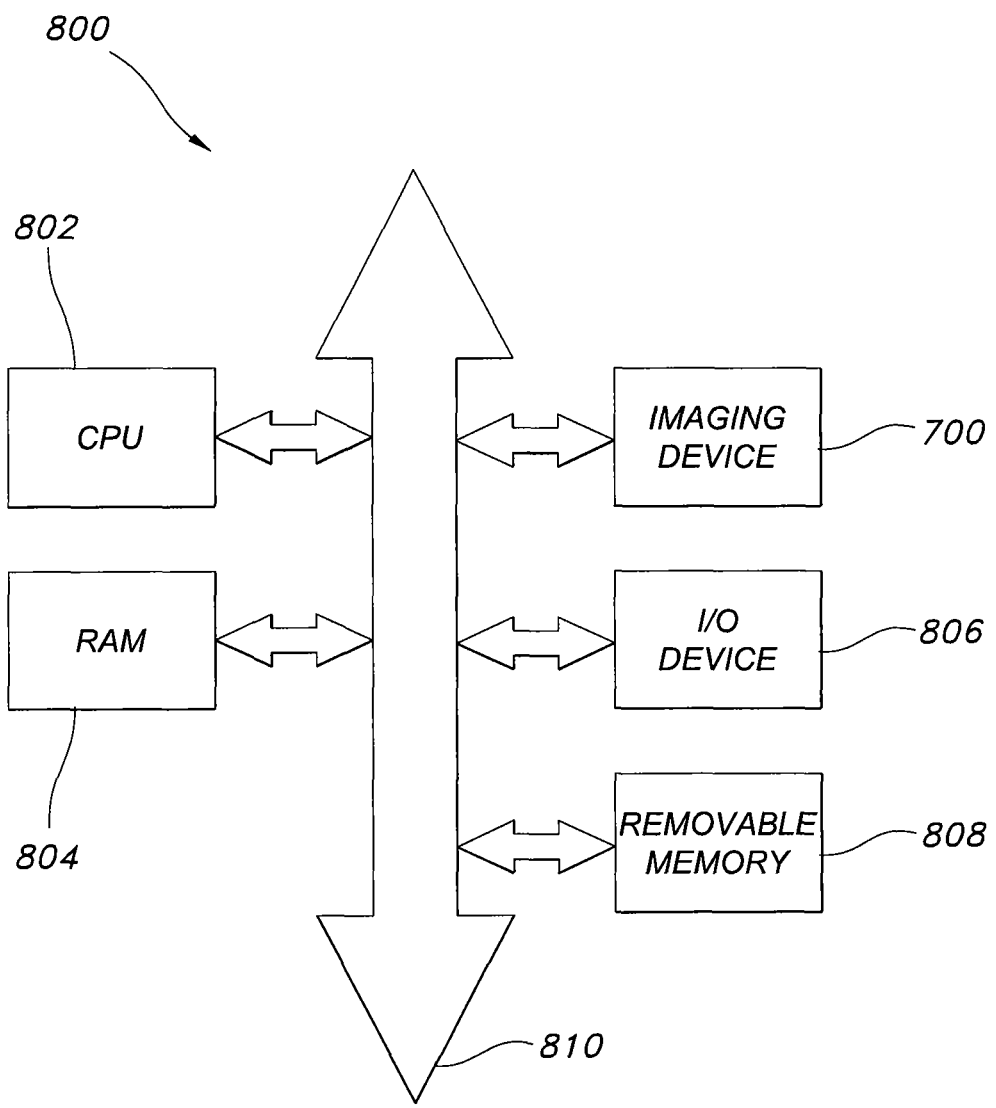
FIG. 8 is a block diagram of a processing system incorporating at least one imaging device constructed in accordance with an embodiment of the invention.

FIG. 8 shows a typical processor-based system, designated generally as 800. The processor-based system 800, as shown, includes central processing unit (CPU) 802 which communicates with input/output (I/O) device 806 and imaging device 700 over bus 810. The processor-based system 800 also includes random access memory (RAM) 804, and removable memory 808, such as a flash memory. At least a part of CPU 802, RAM 804, and imaging device 700 may be integrated on the same circuit chip.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An image sensor pixel comprising:
a photosensor; and
a waveguide grating resonance filter formed over the photosensor and configured to pass light to the photosensor in a wavelength band and to block light outside of the wavelength band,
wherein the waveguide grating resonance filter includes a grating material having a first refractive index and arranged in a grating pattern with a grating pitch, the waveguide grating resonance filter having an effective refractive index that is a function of the first refractive index,
a combination of the grating pitch and the effective refractive index is selected to correspond to the wavelength band, and
the waveguide grating resonance filter includes a substrate, the grating material being formed on the substrate and the effective refractive index being greater than a refractive index of the substrate.

2. The image sensor pixel according to claim 1, wherein the waveguide grating resonance filter is configured as a guided mode resonance transmission filter, and the wavelength band corresponds to a resonant filter bandwidth of the waveguide grating resonance filter.

3. The image sensor pixel according to claim 1, further comprising:
a filling material or medium having a second refractive index formed between the grating material in the grating pattern,
wherein the effective refractive index is a function of the first refractive index and the second refractive index.

4. The image sensor pixel according to claim 3, wherein the wavelength band is selected based on at least one of the grating pitch, the first refractive index, the second refractive index, a thickness of the waveguide grating resonance filter, a first absorption coefficient of the grating material or a second absorption coefficient of the filling material or medium.

5. The image sensor pixel according to claim 3, wherein the filling material or medium includes a filling material including an epoxide polymer or quartz.

6. The image sensor pixel according to claim 3, wherein the filling material or medium includes a filling medium including at least one of a vacuum or an ambient atmosphere.

7. The image sensor pixel according to claim 1, wherein the grating material is selected from materials having a refractive index less than about 3.5.

8. The image sensor pixel according to claim 7, wherein the grating material includes organic polymer materials.

9. The image sensor pixel according to claim 1, wherein the grating material is selected from materials having a refractive index greater than or equal to about 3.5.

10. The image sensor pixel according to claim 9, wherein the grating material includes at least one of hafnium dioxide or titanium dioxide.

11. The image sensor pixel according to claim 1, wherein the waveguide grating resonance filter includes a superstrate, and the grating material is formed between the substrate and the superstrate.

12. The image sensor pixel according to claim 11, wherein the grating pattern is configured as a sub-wavelength grating and the effective refractive index is greater than the refractive index of the substrate and a refractive index of the superstrate.

13. An imager pixel array comprising:
an array of photosensors; and
a plurality of waveguide grating resonance filters formed over the array of photosensors, each waveguide grating resonance filter including a respectively different grating material and configured to pass respectively different wavelength bands of light to a respective photosensor in the array of photosensors,
wherein each waveguide grating resonance filter includes an associated effective refractive index corresponding to the respective different wavelength bands, and
each waveguide grating resonance filter includes a respective substrate, the corresponding grating material is formed on the respective substrate and the respective effective refractive index is greater than a refractive index of the corresponding substrate.

14. The imager pixel array according to claim 13, wherein each waveguide grating resonance filter is configured as a guided mode resonance transmission filter.

15. The imager pixel array according to claim 13, wherein each waveguide grating resonance filter is configured to block light outside of the corresponding wavelength band.

16. The imager pixel array according to claim 13, wherein, for each waveguide grating resonance filter, the grating material is configured with a grating profile.

17. The imager pixel array according to claim 16, wherein the grating profile includes a rectangular profile.

18. The imager pixel array according to claim 16, wherein the grating profile includes a sinusoidal profile.

19. The imager pixel array according to claim 13, wherein, for each waveguide grating resonance filter, the corresponding grating material includes a first refractive index and is arranged in a grating pattern with a grating pitch, and the associated effective refractive index is a function of the respective first refractive index.

20. The imager pixel array according to claim 13, wherein each waveguide grating resonance filter for the respectively different wavelength bands includes a common grating pitch.

21. The imager pixel array according to claim 13, wherein each waveguide grating resonance filter for the respectively different wavelength bands includes a respectively different grating pitch.

22. The imager pixel array according to claim 13, further comprising, for each waveguide filter, a corresponding filling material or medium having a second refractive index formed between the grating material in the grating pattern,
wherein the effective refractive index is a function of the first refractive index and the second refractive index.

23. The imager pixel array according to claim 22, wherein the filling material or medium includes a common filling material or medium for each waveguide grating resonance filter for the different wavelength bands.

24. The imager pixel array according to claim 22, wherein the filling material includes a respectively different filling material or medium for each waveguide grating resonance filter for the respective different wavelength bands.

25. The imager pixel array according to claim 22, wherein each waveguide grating resonance filter is configured to pass a respective one of the different wavelength bands based on at least one of the respective effective refractive index, the respective grating pitch, the respective first refractive index, the respective second refractive index, a thickness of the respective waveguide grating resonance filter, a respective first absorption coefficient of the corresponding grating material or a respective second absorption coefficient of the filling material or medium.

26. An imager pixel array comprising:
an array of photosensors; and
a plurality of waveguide grating resonance filters formed over the array of photosensors, each waveguide grating resonance filter including a respective grating material arranged in a grating pattern with a grating pitch and configured to pass respectively different wavelength bands of light to a respective photosensor in the array of photosensors,
wherein the grating pitch includes a common grating pitch for all of the waveguide grating resonance filters for the different wavelength bands, and
the plurality of waveguide grating resonance filters for the respectively different wavelength bands include respectively different effective refractive indices corresponding to the respective different wavelength bands.

27. The imager pixel array according to claim 26, wherein, for each waveguide grating resonance filter, the corresponding grating material includes a first refractive index and the associated effective refractive index is a function of the first refractive index.

28. The imager pixel array according to claim 27, further comprising, for each waveguide grating resonance filter:
a corresponding filling material or medium having a second refractive index formed between the respective grating material in the grating pattern,
wherein the associated effective refractive index of the corresponding wavelength band is based on the first refractive index and the second refractive index.

29. The image sensor pixel according to claim 28, wherein each wavelength grating resonance filter is configured to have the respective wavelength band based on one or more of the common grating pitch, the respective first refractive index, the respective second refractive index, a thickness of the respective waveguide grating resonance filter, a respective first absorption coefficient of the corresponding grating material or a respective second absorption coefficient of the corresponding filling material or medium.

30. An imager system comprising:
an imager array comprising:
an array of photosensors, and
a waveguide grating resonance filter layer formed over the array of photosensors, the waveguide grating resonance filter layer including a plurality of waveguide grating resonance filters formed from respectively different grating materials to pass light in respectively different colors to the array of photosensors;
peripheral circuitry configured to receive pixel signals from the array of photosensors based on the light in the respectively different colors passed by waveguide grating resonance filter and to generate digitized pixel signals; and
a processor configured to process the digitized pixel signals to generate image data representing an image captured by the imager array,
wherein each waveguide grating resonance filter is configured with a different effective refractive index corresponding to the respectively different colors, and
each waveguide grating resonance filter includes a respective substrate, the corresponding grating material is formed on the respective substrate and the respective effective refractive index is greater than a refractive index of the corresponding substrate.

31. The imager system of claim 30, wherein the processor is configured to selectively combine the passed different colors in the image data to emulate a response of a human eye.

32. The imager system according to claim 30, wherein, for each waveguide grating resonance filter, the corresponding grating material includes a refractive index and is arranged in a grating pattern with a grating pitch and the associated effective refractive index is a function of the corresponding refractive index.

33. The imager system according to claim 32, wherein each grating material is selected to pass light having the respective color based on one or more of the respective refractive index, a thickness of the respective waveguide grating resonance filter or an absorption coefficient of the corresponding grating material.

34. An imager array comprising:
an array of photosensors;
a plurality of optical filters formed over the photosensor array for passing light in a respective plurality of wavelength bands to corresponding photosensors; and
at least one waveguide grating resonance filter formed between the array of photosensors and the plurality of optical filters, the at least one waveguide grating resonance filter configured to pass light in at least one further wavelength band and to block light outside of the further wavelength band wherein the at least one waveguide grating resonance filter is configured to block infrared light.

35. The imager array according to claim 34, wherein the plurality of optical filters include an array of color filters.

36. The imager array according to claim 34, wherein the plurality of optical filters include a plurality of further waveguide grating resonance filters.

37. The imager array according to claim 34, further comprising a dielectric between the plurality of optical filters and the at least one waveguide grating resonance filter.

38. The imager array according to claim 34, further comprising a dielectric formed over the array of photosensors, wherein the at least one waveguide grating resonance filter is formed over the dielectric.

* * * * *